(12) United States Patent
Inoue et al.

(10) Patent No.: US 7,044,763 B1
(45) Date of Patent: May 16, 2006

(54) SFP MODULE MOUNTING STRUCTURE

(75) Inventors: Takashi Inoue, Kawasaki (JP); Hiroshi Takawa, Kawasaki (JP); Yasuhiro Teshima, Kawasaki (JP); Noboru Izuhara, Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 11/166,222

(22) Filed: Jun. 27, 2005

(30) Foreign Application Priority Data

Mar. 25, 2005 (JP) .............................. 2005-088825

(51) Int. Cl.
*H01R 13/62* (2006.01)

(52) U.S. Cl. .................................. 439/326

(58) Field of Classification Search ............... 439/326
See application file for complete search history.

(56) References Cited

U.S. PATENT DOCUMENTS

| | | | | |
|---|---|---|---|---|
| 6,443,768 B1 * | 9/2002 | Dirkers et al. | ............ | 439/607 |
| 6,517,382 B1 * | 2/2003 | Flickinger et al. | .......... | 439/607 |
| 6,524,134 B1 * | 2/2003 | Flickinger et al. | .......... | 439/607 |
| 6,530,785 B1 * | 3/2003 | Hwang | ...................... | 439/76.1 |
| 6,533,470 B1 * | 3/2003 | Ahrens | ........................ | 385/88 |
| 6,556,446 B1 * | 4/2003 | Hwang | ........................ | 361/728 |
| 6,570,768 B1 * | 5/2003 | Medina | ....................... | 361/747 |
| 6,612,868 B1 * | 9/2003 | Hwang | ........................ | 439/607 |
| 6,655,995 B1 | 12/2003 | Reisinger et al. | ........... | 439/607 |
| 6,705,879 B1 * | 3/2004 | Engel et al. | ................. | 439/76.1 |
| 6,729,905 B1 * | 5/2004 | Hwang | ....................... | 439/607 |
| 6,731,510 B1 * | 5/2004 | Hwang et al. | ............... | 361/754 |
| 6,752,663 B1 * | 6/2004 | Bright et al. | ................ | 439/607 |
| 6,758,699 B1 * | 7/2004 | Hwang et al. | ............... | 439/676 |
| 6,762,940 B1 * | 7/2004 | Zaremba | ....................... | 361/728 |
| 6,819,568 B1 * | 11/2004 | Cao | ............................. | 361/728 |
| 6,822,872 B1 * | 11/2004 | Schulz et al. | ................ | 361/747 |
| 6,824,429 B1 * | 11/2004 | Hwang | ....................... | 439/607 |
| 6,830,383 B1 * | 12/2004 | Huang | ........................... | 385/92 |
| 6,848,943 B1 * | 2/2005 | Machado et al. | ............ | 439/607 |
| 6,866,544 B1 * | 3/2005 | Casey et al. | ................ | 439/607 |
| 6,884,097 B1 * | 4/2005 | Ice | .............................. | 439/160 |
| 6,885,560 B1 * | 4/2005 | Zaremba | ....................... | 361/754 |
| 6,887,092 B1 * | 5/2005 | Minota | ........................ | 439/372 |
| 6,890,206 B1 * | 5/2005 | Distad et al. | ................ | 439/372 |
| 6,893,293 B1 * | 5/2005 | Ice et al. | ..................... | 439/607 |
| 6,893,294 B1 * | 5/2005 | Moriyama et al. | .......... | 439/607 |
| 6,916,196 B1 * | 7/2005 | Long et al. | .................. | 439/352 |
| 6,926,551 B1 * | 8/2005 | Schulz et al. | ................ | 439/357 |
| 6,926,565 B1 * | 8/2005 | Fogg | ............................ | 439/862 |
| 2002/0131725 A1 * | 9/2002 | Ahrens | ......................... | 385/88 |
| 2003/0021552 A1 * | 1/2003 | Mitchell | ....................... | 385/92 |
| 2003/0072540 A1 * | 4/2003 | Huang | ........................... | 385/92 |

(Continued)

*Primary Examiner*—Ross Gushi
(74) *Attorney, Agent, or Firm*—Bingham McCutchen LLP (57) ABSTRACT

In an SFP module mounting structure where an SFP module connected to a connector mounted on a printed board is held by a holder, the holder has both side faces which hold the SFP module on the both sides, a flap which is provided on an upper edge of the both side faces so as to make the SFP module insertable and extractable in an oblique upper direction as well as to prevent the SFP module from being disengaged upward and a bottom face which supports the both side faces on the printed board. The connector may be provided with an electrode which is connected to the SFP module when the SFP module is inserted into the holder from the oblique upper direction and which has a returning elastic force enabling the SFP module to move pivotally down to a state that is parallel to the printed board.

10 Claims, 7 Drawing Sheets

U.S. PATENT DOCUMENTS

| | | | |
|---|---|---|---|
| 2003/0100204 A1* | 5/2003 | Hwang | 439/92 |
| 2003/0171022 A1* | 9/2003 | Distad et al. | 439/372 |
| 2003/0198025 A1* | 10/2003 | Cao | 361/728 |
| 2003/0198026 A1* | 10/2003 | Bui | 361/728 |
| 2003/0206403 A1* | 11/2003 | Zaremba | 361/728 |
| 2003/0228799 A1* | 12/2003 | Machado et al. | 439/607 |
| 2004/0029417 A1* | 2/2004 | Engel et al. | 439/76.1 |
| 2004/0066639 A1* | 4/2004 | Little et al. | 361/797 |
| 2004/0070953 A1* | 4/2004 | Schulz et al. | 361/752 |
| 2004/0077217 A1* | 4/2004 | Hwang et al. | 439/607 |
| 2004/0077226 A1* | 4/2004 | Murr et al. | 439/701 |
| 2004/0097136 A1* | 5/2004 | Flickinger et al. | 439/607 |
| 2004/0110406 A1* | 6/2004 | Phillips et al. | 439/676 |
| 2004/0132327 A1* | 7/2004 | Minota | 439/160 |
| 2004/0185696 A1* | 9/2004 | Long et al. | 439/160 |
| 2004/0219819 A1* | 11/2004 | Di Mascio | 439/352 |
| 2005/0037655 A1* | 2/2005 | Henry et al. | 439/341 |
| 2005/0041407 A1* | 2/2005 | Torres et al. | 361/797 |
| 2005/0100292 A1* | 5/2005 | Malagrino, Jr. | 385/92 |
| 2005/0164533 A1* | 7/2005 | Regnier et al. | 439/79 |
| 2005/0170695 A1* | 8/2005 | Togami et al. | 439/607 |
| 2005/0195565 A1* | 9/2005 | Bright | 361/688 |
| 2005/0208831 A1* | 9/2005 | Lee | 439/608 |
| 2005/0227518 A1* | 10/2005 | Hartman | 439/157 |
| 2005/0245109 A1* | 11/2005 | Torres et al. | 439/76.1 |

* cited by examiner

PRIOR ART

SFP MODULE MOUNTING STRUCTURE

BACKGROUND OF THE INVENTION

1. Field of the Invention

The present invention relates to an SFP (Small Form Factor Pluggable) module mounting structure, and in particular to an SFP module mounting structure where an SFP module connected to a connector mounted on a printed board (hereinafter, occasionally referred to as PT board) is held by a holder or a cage (hereinafter, collectively referred to as a holder).

2. Description of the Related Art

Figure 7A:
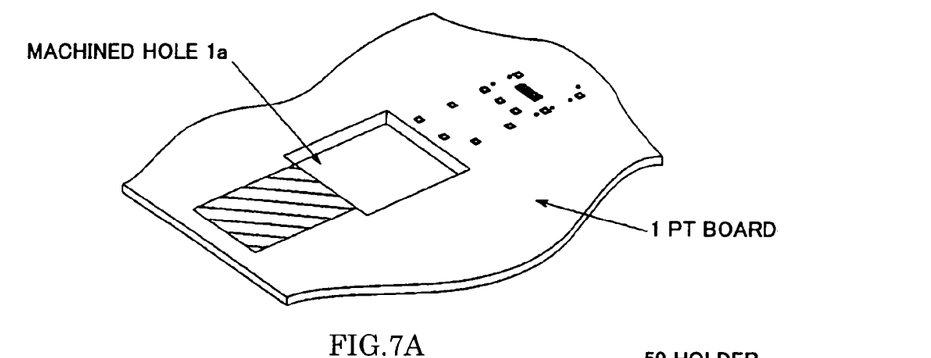
FIGS. 7A–7C are perspective views showing a prior art SFP module mounting structure.
Figure 7B:
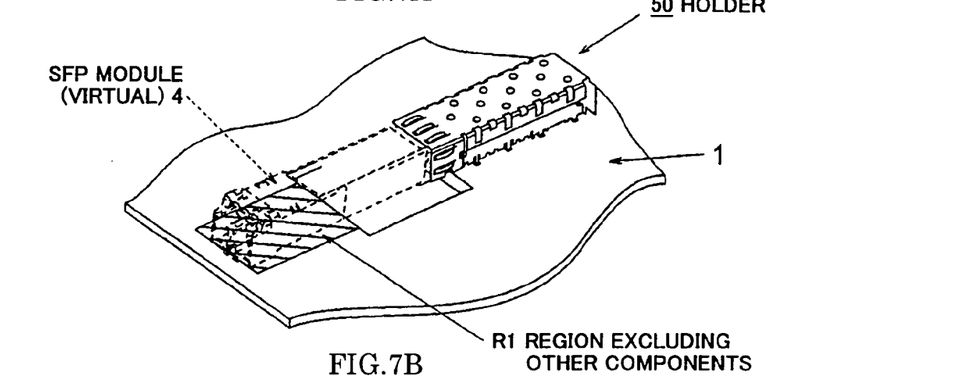
Figure 7C:
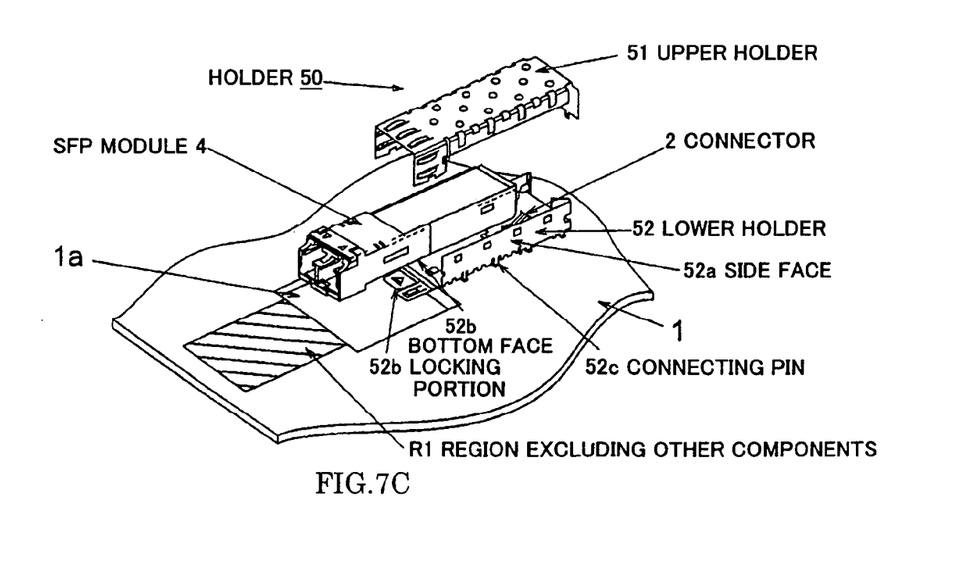

A prior art technology related to such an SFP module mounting structure is shown in FIGS. 7A–7C. As shown in FIG. 7A, firstly at a designing stage, a machined hole 1a for a locking portion (not shown) of an SFP module is provided to a PT board 1 for mounting the SFP module.

Thereafter, as shown in FIG. 7B, a holder 50 for holding the SFP module is mounted on the PT board 1, and an SFP module 4 (not shown) is inserted into the holder 50. A state where the SFP module 4 is extracted is virtually shown by dotted lines. As seen from this state, at the time of inserting and extracting the SFP module 4, it is required to reserve a region R1 (shown by hatching) for the portion of a stroke. This region R1 is an area where other components cannot be mounted thereon.

The state shown by solid lines in FIG. 7B is configured by a procedure shown in FIG. 7C at the following manufacturing stage:

(1) Firstly, a lower holder 52 is mounted on the PT board 1. The lower holder 52 has a side face 52a, a bottom face 52b and a connecting pin 52c with standoffs.

(2) The SFP module 4 is inserted from above along the lower holder 52, fitted into a connector 2, and then covered with an upper holder 51.

(3) The SFP module 4 is locked into a locking portion 52d that is a part of the bottom face 52b of the lower holder 52 to be secured, so that the SFP module 4 is held.

It is to be noted that as a technology related to such a prior art technology, there is an electric connector receptacle cage having the upper holder and the lower holder shown in FIG. 7C unified so as to have the SFP module inserted therein (see e.g. patent document 1).

[patent document 1]

U.S. Pat. No. 6,655,995 B1

In the prior art technology shown in FIGS. 7A–7C, the SFP module is mounted on the PT board by the combination of the upper holder and the lower holder, so that there has been a problem that the process of further covering the SFP module with the upper holder after having the SFP module inserted into the lower holder is required, and that the region R1 excluding the other components as shown in FIG. 7C is required when the SFP module 4 is extracted from such a holder composed of an upper holder and a lower holder.

Also, by covering the SFP module with the upper holder, the thermal (heat) dissipation of the SFP module is impaired, so that it becomes disadvantageous in terms of heat.

SUMMARY OF THE INVENTION

It is accordingly an object of the present invention to provide a simple structure for a holder and to minimize a region excluding the other components in an SFP module mounting structure where an SFP module connected to a connector mounted on a printed board is held by the holder.

In order to achieve the above-mentioned object, an SFP module mounting structure according to the present invention is characterized in that the holder has both side faces which hold the SFP module on the both sides, a flap which is provided on an upper edge of the both side faces so as to make the SFP module insertable and extractable in an oblique upper direction as well as to prevent the SFP module from being disengaged upward and a bottom face which supports the both side faces on the printed board.

Namely, in the present invention, the upper holder as shown in FIG. 7C is not used but a flap is provided on an upper edge on both side faces of a lower holder, thereby exerting an effect of functioning as an upper holder. Accordingly, the SFP module can be inserted into the holder from an oblique upper direction, and the flap prevents the SFP module from being disengaged upward at this time.

Thus, the heat dissipation of the SFP module is not impaired since the portion corresponding to the upper holder is formed only of the flap. Also, a stroke region at the time of mounting the SFP module can be minimized.

Also, for the above-mentioned connector, one provided with an electrode which is connected to the SFP module when the SFP module is inserted into the holder from the oblique upper direction and which has a returning elastic force enabling the SFP module to move pivotally down to a state that is parallel to the printed board may be used.

Namely, in this case, the connector has a structure that the SFP module is always inserted from the oblique upper direction, so that by inserting the SFP module through the holder into an electrode of the connector, the SFP module is fitted into the connector in the oblique upper direction.

In such a state, the SFP module projects out of the printed board, so that it is required to move the SFP module pivotally down to a state where it is parallel to the printed board. At this time, by holding the SFP module within the holder through the flaps provided on the holder, the SFP module can be locked by the flaps of the holder even when an elastic force of an electrode of the connector gives a power of pivotal move in the returning direction.

Also, the bottom face of the holder may have a portion preventing the SFP module from being disengaged.

Namely, since a portion for preventing the SFP module from being disengaged is provided on the bottom face of the holder, it is made possible to prevent the SFP module from being disengaged in a direction toward the head after the SFP module is inserted into the holder.

Also, the both side faces of the holder may be provided with a plurality of connector pins with standoffs which have different lengths so that the both side faces are lowered from a head of the SFP module towards the connector.

Namely, in this case, the connecting pins for the printed board have standoffs made shorter from the head of the SFP module towards the connector. Therefore, it becomes easier for the SFP module to be inserted upon insertion and harder to be disengaged compared to the case where the SFP module is mounted parallel on the printed board.

It is to be noted that the above-mentioned flap may preferably have a curve which makes the SFP module easy to be inserted into the holder.

Also, the bottom face may have a locking portion which prevents the SFP module from being disengaged.

Also, in the above-mentioned SFP mounting structure provided with the connector, the holder may have a top face which partially covers a top face of the SFP module and both side faces which secure the top face on the printed board on the both sides of the SFP module.

In this case, the holder partially covers the top face of the SFP module, and the SFP module can be secured on the printed board by the both side faces. Therefore, it is made possible to hold the SFP module with the holder of a simpler structure.

Also, the printed board may have a machined hole which prevents the SFP module from being disengaged.

According to the present invention, the stroke region when mounting the SFP module on the printed board can be minimized and the heat dissipation of the SFP module can be improved since the upper holder is not required. Also, by using connecting pins with standoffs of different lengths, the machined hole of the locking portion for the holder and the SFP module becomes unnecessary on the printed board. Thus, a high density mounting of components is made possible on the printed board.

BRIEF DESCRIPTION OF THE DRAWINGS

The above and other objects and advantages of the invention will be apparent upon consideration of the following detailed description, taken in conjunction with the accompanying drawings, in which the reference numerals refer to like parts throughout and in which.

DESCRIPTION OF THE EMBODIMENTS

Embodiment [1]

Figure 1A:
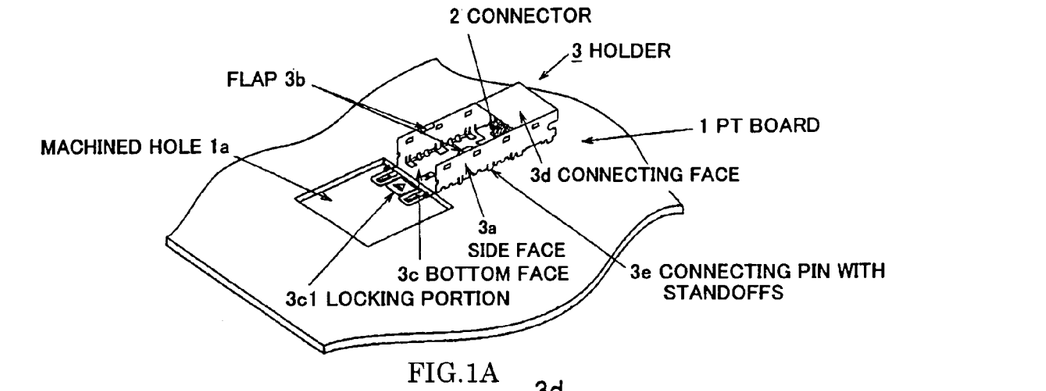
FIGS. 1A–1C are diagrams showing an embodiment [1] of an SFP module mounting structure according to the present invention.
Figure 1B:
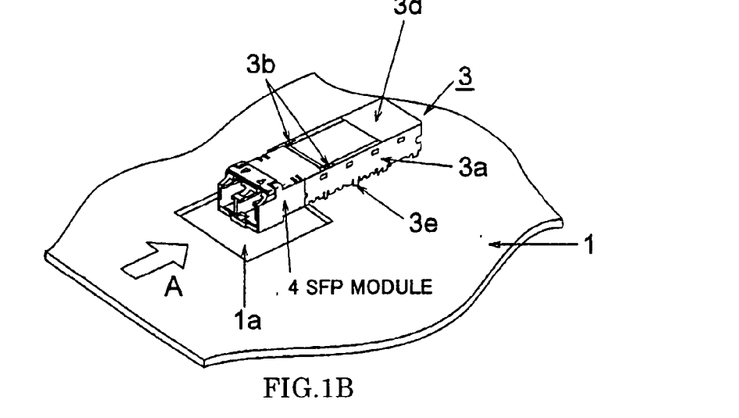
Figure 1C:
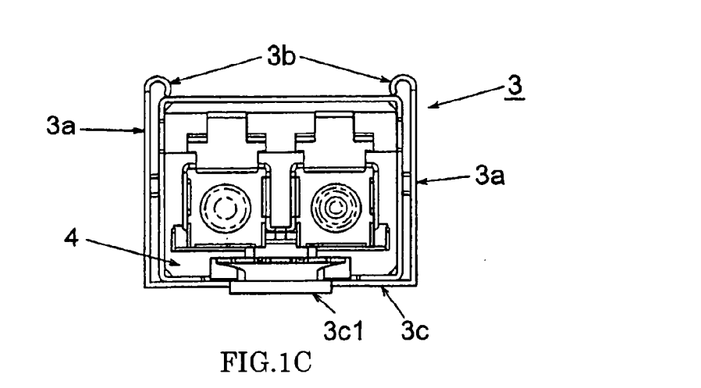

FIGS. 1A–1C show an embodiment [1] of an SFP module mounting structure according to the present invention. This embodiment [1], as shown in FIG. 1A, is the same as the prior art example shown in FIGS. 7A–7C in that a machined hole 1a is provided to a PT board 1. Also, a holder 3 is mounted on the PT board 1. The holder 3 has a side face 3a, a flap 3b provided on the upper edge of the side face 3a, a bottom face 3c supporting the both side faces 3a and a connecting pin 3e with standoffs for securing the holder 3 against the PT board 1. Also, the both side faces 3a are partially unified with a connecting face 3d. Moreover, the bottom face 3c of the holder 3 is provided with a locking portion 3c1.

FIG. 1B shows a state where an SFP module 4 is mounted on the PT board 1 in the state shown in FIG. 1A. Namely, the SFP module 4 is inserted from the oblique upper direction towards a connector 2 (FIG. 1A) located within the holder 3 and mounted on the PT board 1, so that it is made possible to mutually connect a connector (not shown) of the SFP module 4 and the connector 2 mounted on the PT board 1, and to contain the entire SFP module 4 within the holder 3 through the flap 3b. At this time, the locking portion 3c1 locks the SFP module to be secured.

FIG. 1C shows a side view observed from the direction of an arrow A in the mounted state shown in FIG. 1B. As seen from FIG. 1C, the flap 3b is curved inward in the holder 3, so that it is made easy to insert the SFP module 4 into the holder 3 from the oblique upper direction.

Thus, in the embodiment [1] of the present invention, the upper holder 51 shown in FIG. 7C is substantially made unnecessary. Also, it is made possible to insert the SFP module 4 into the holder 3 from the oblique upper direction, so that the region R1 excluding other components shown in FIGS. 7A–7C can be minimized.

It is to be noted that when extracting the SFP module 4 under the mounted state shown in FIG. 1B, by pushing the locking portion 3c1 of the bottom face 3c shown in FIG. 1A from beneath the machined hole 1a, the SFP module 4 can be unlocked, so that it is made possible to extract the SFP module 4 in the oblique upper direction.

Embodiment [2]

Figure 2A:
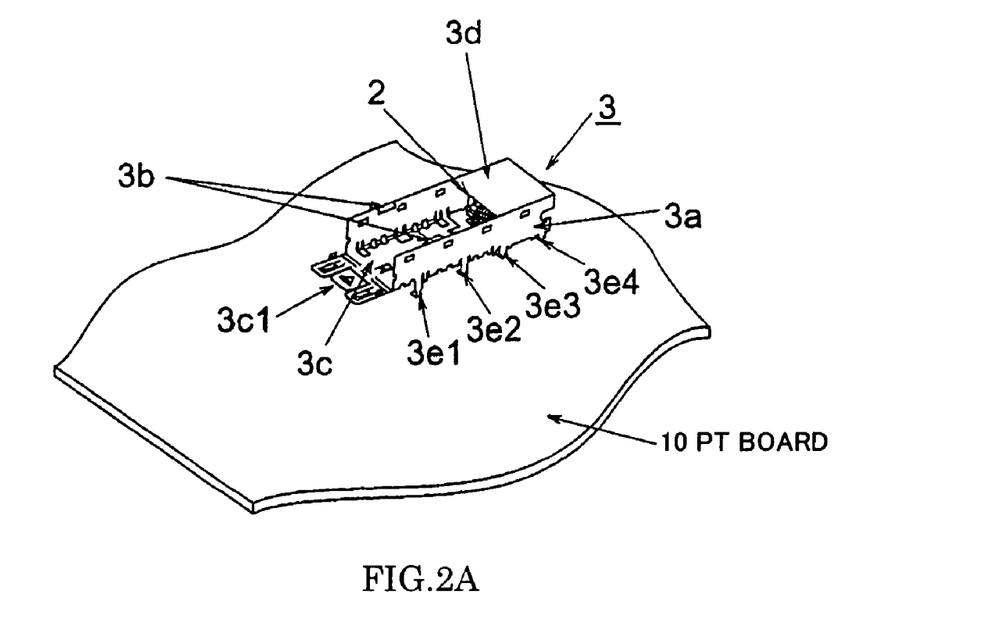
FIGS. 2A and 2B are diagrams showing an embodiment [2] of an SFP module mounting structure according to the present invention.
Figure 2B:
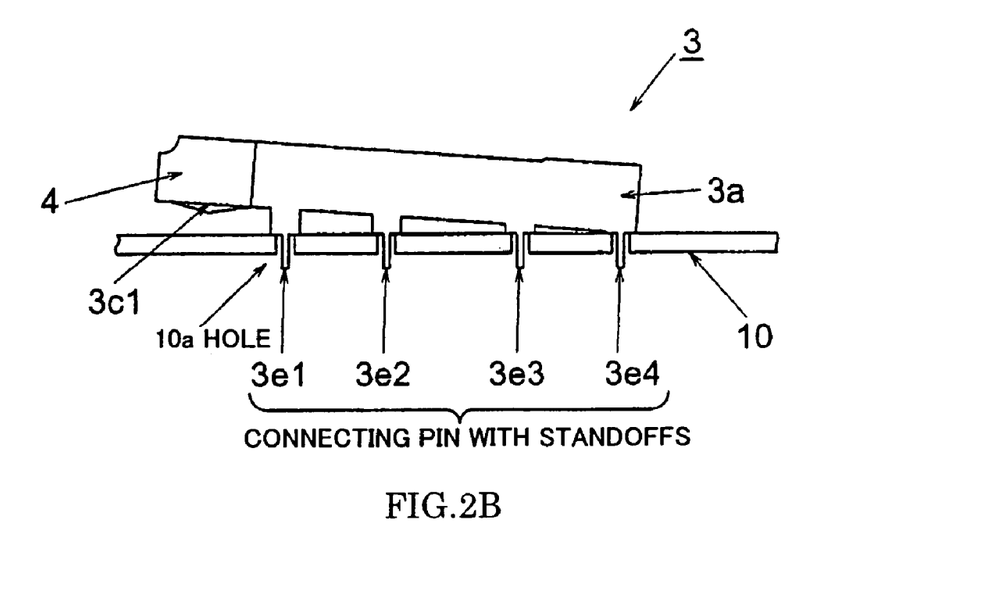

In this embodiment [2], the connecting pin 3e with standoffs provided to the holder 3 shown in FIGS. 1A and 1B is made to have a structure as shown in FIG. 2B, for example, with four connecting pins 3e1–3e4 with standoffs which are made gradually shorter. Thus, the SFP module 4 can be more easily inserted into the holder 3 from the oblique upper direction from the holder 3.

Also, since the head portion of the SFP module is lifted from the PT board, the locking portion 3c1 of the holder 3 and the SFP module 4 can be mutually unlocked even without a machined hole. Therefore as shown in FIG. 2A, the PT board 10 is not provided with a machined hole.

Embodiment [3]

While in the above mentioned embodiments [1] and [2], the connector 2 is mounted on the PT board 1 or 10 in the same way as in the prior art example (see FIG. 7C), this embodiment [3] further reduces a stroke region of the SFP module 4, enabling a connector connecting the SFP module 4 to the PT board 1 to move pivotally.

Figure 3A:
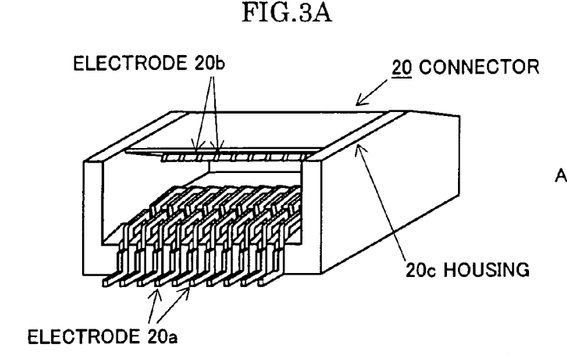
FIGS. 3A–3I are diagrams showing an embodiment [3] of an SFP module mounting structure according to the present invention.

Namely, as shown in FIG. 3A, a connector 20 has electrodes 20a and 20b within a housing 20c. The electrodes 20a and 20b have portions that are mutually parallel and facing the oblique upper direction, with a structure that a returning elastic force acts when moved from this state.

Figure 3B:
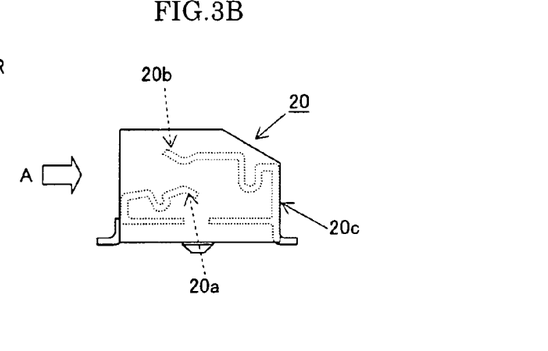
Figure 3C:
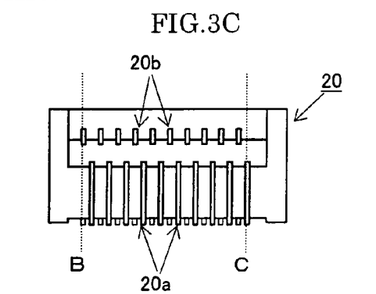
Figure 3D:
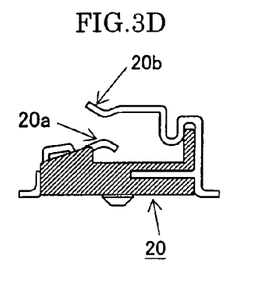
Figure 3E:
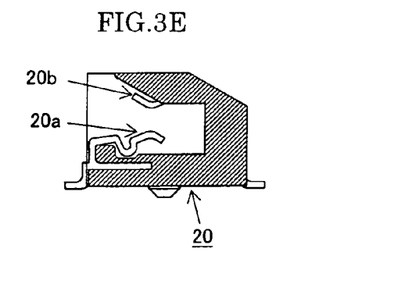

FIG. 3C shows a diagram where the connector 20 shown in FIG. 3B is observed from the direction of an arrow A. FIG. 3D shows a diagram where the connector 20 is sectioned at a line B shown in FIG. 3C. FIG. 3E shows a diagram where the connector 20 is sectioned at a line C shown in FIG. 3C.

As seen from these figures, the heads of the electrodes 20a and 20b have portions that are mutually parallel in a slightly displaced form, and the direction forced by the electrodes 20a and 20b for the SFP module 4 is the oblique upper direction.

Figures 3F, 3G:
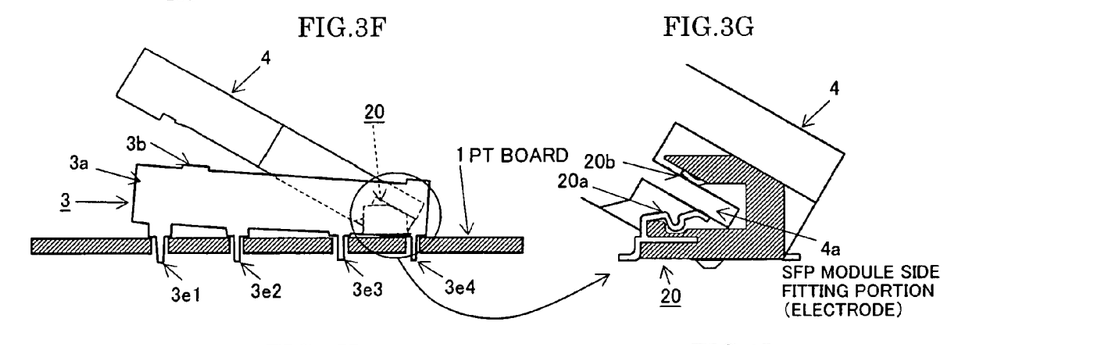

FIG. 3F shows a side view when such a connector 20 is mounted on the PT board 1, the holder 3 is mounted on the PT board 1 in a form that the connector 20 is contained therein, and the SFP module 4 is connected to the connector 20.

FIG. 3G shows a sectional side view where the portion of the connector 20 is enlarged in this side view. As shown in this sectional side view, a fitting portion 4a of the SFP module 4 is fitted into between the electrodes 20a and 20b, so that the SFP module 4 is held in the oblique upper direction.

Therefore, in order to keep the SFP module 4 in parallel with the PT board 1 in such a projecting state, a portion for holding the SFP module 4 withstanding the returning elastic force by the electrodes 20a and 20b of the connector 20 is required, while the flap 3b provided on the upper edge of the side face 3a serves the function.

Figures 3H, 3I:
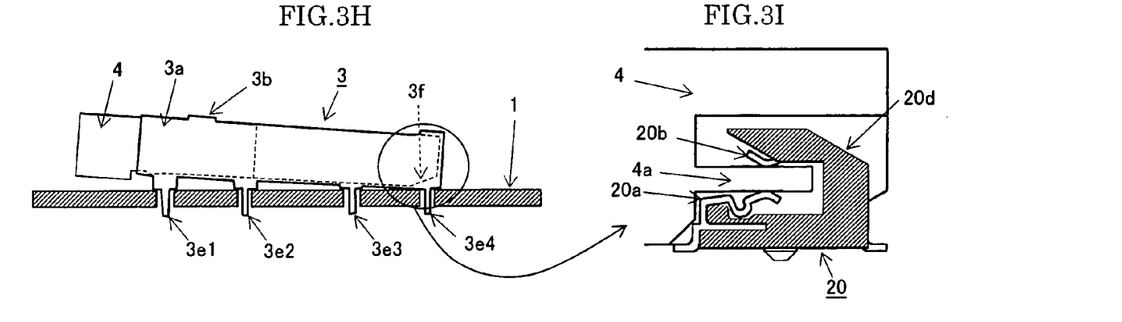

As a result, as shown in FIG. 3H, the SFP module 4 is held in a form housed in the holder 3. FIG. 3I shows an enlarged sectional side view of the connector 20 at this time. In the fitting portion 4a, while the returning elastic force by the electrodes 20a and 20b acts on the SFP module 4, the flap 3b keeps down the SFP module 4 in parallel with the PT board 1.

It is to be noted that while in the side views of FIGS. 3F and 3H among FIGS. 3A–3I showing the embodiment [3], the holder 3 is shown to have the standoffs gradually shortened from the head of the SFP module 4 towards the connector 20 for the connecting pins 3e1–3e4 with standoffs, such a variation in the lengths of the standoffs is not essential but the lengths may be made the same. However, in this case, it is required that the machined hole 1a is provided in the PT board 1 as is the case of embodiment [1] shown in FIGS. 1A–1C.

Embodiment [4]

In this embodiment [4], the holder 3 shown in FIGS. 3F and 3H in the embodiment [3] shown in FIGS. 3A–3I is made smaller and simpler.

Figure 4A:
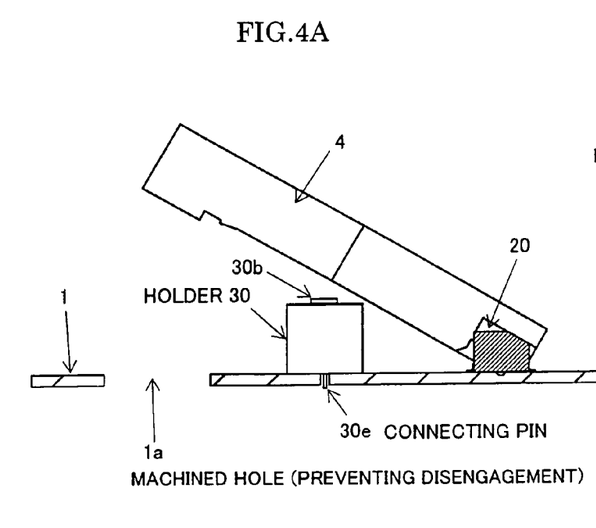
FIGS. 4A–4C are diagrams showing an embodiment [4] of an SFP module mounting structure according to the present invention.

Namely, in this embodiment [4], the holder 30 has a width as shown in FIG. 4A, composed of a side face 30a, a flap 30b provided on the upper edge of the side face 30a and a bottom face 30c holding these side faces 30a. A connecting pin 30e with standoffs is provided to the bottom face 30c or the side face 30a.

Figure 4B:
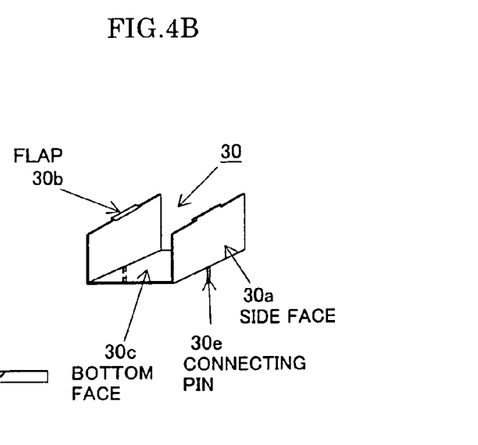
Figure 4C:
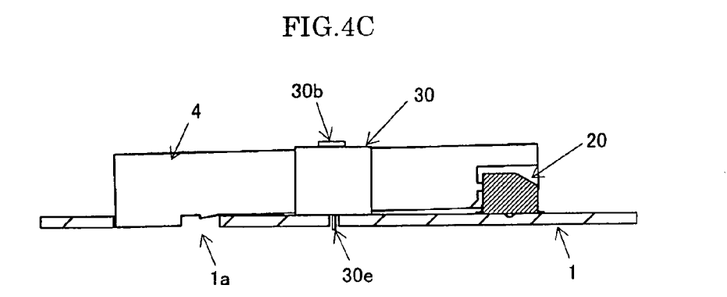

In the same way as in FIG. 3H, when the SFP module 4 is kept down by the flap 30b of the holder 30, in order to prevent the SFP module 4 from being disengaged with the simple holder 30 as shown in FIG. 4C, and in order to detach the SFP module 4 from the holder 30, it is also required that the machined hole 1a is provided in the PT board 1. Also in this case, the SFP module 4 is lifted from beneath the machined hole 1a so that the flap 30 may be unlocked, extracting the SFP module from the holder 30.

Embodiment [5]

Figure 5A:
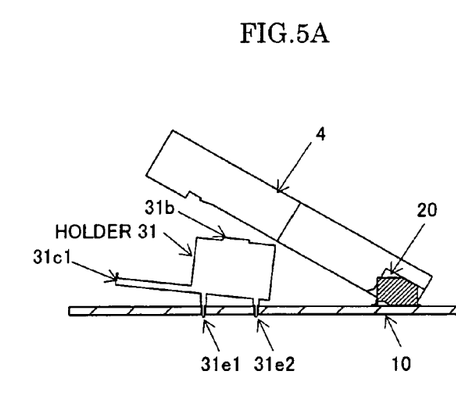
FIGS. 5A–5C are diagrams showing an embodiment [5] of an SFP module mounting structure according to the present invention.
Figure 5B:
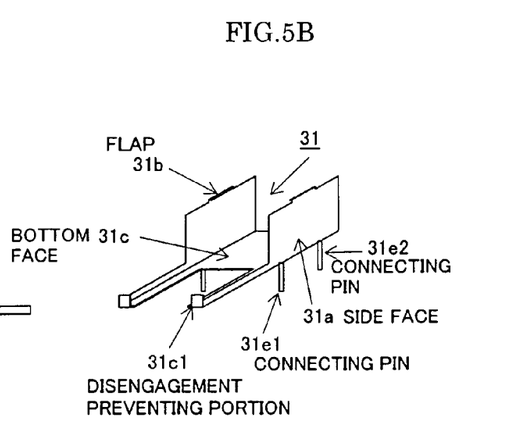
Figure 5C:
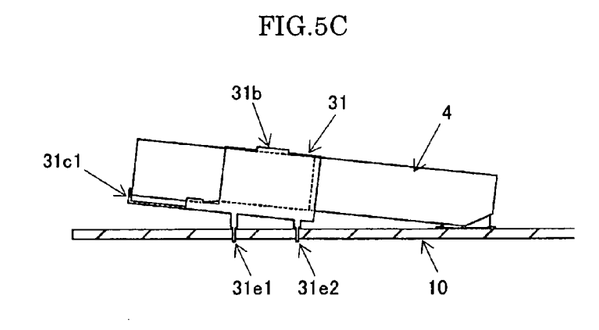

This embodiment [5], as shown in FIGS. 5A–5C, is a modification of the embodiment [4] shown in FIGS. 4A–4C.

Namely, also in this embodiment [5], as shown in FIG. 5A, a simple holder 31 is used as a holder. The holder 31 is provided with a continuous disengagement preventing portion 31c1 on the bottom face 31c (see FIG. 5B). Also, the side face 31a is provided with connecting pins 31e1 and 31e2 with standoffs of different lengths.

As a result, as shown in FIG. 5C, when the SFP module 4 is held by this simple holder 31, the SFP module 4 can be mounted in the oblique upper direction from the PT board 10 in the same way as in the case shown in FIG. 3H. In this case, a dropped or a disengaged state of the SFP module 4 is prevented by the disengagement preventing portion 31c1.

It is to be noted also in this embodiment [5] that the lengths of the connecting pins 31e1 and 31e2 with standoffs may be made the same and have the holder 3 and the SFP module placed in parallel with the PT board 10. However, in this case, it is required that the machined hole (disengagement preventing hole) is provided in the PT board 10 as in the above-mentioned embodiment [4].

Embodiment [6]

Figure 6A:
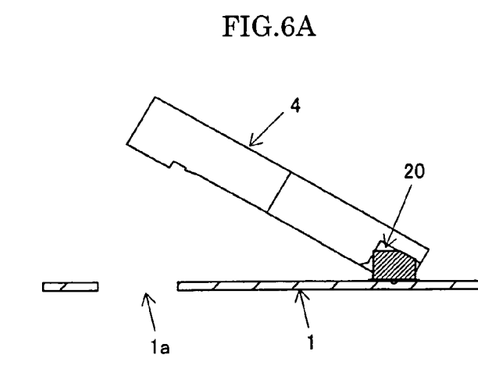
FIGS. 6A–6D are diagrams showing an embodiment [6] of an SFP module mounting structure according to the present invention.

This embodiment [6], as shown in FIGS. 6A–6D, is different from each of the above-mentioned embodiments in that suppressing the SFP module 4 from above is adopted in a state where the SFP module 4 is upheld by the connector 20 as shown in FIG. 6A.

Figure 6B:
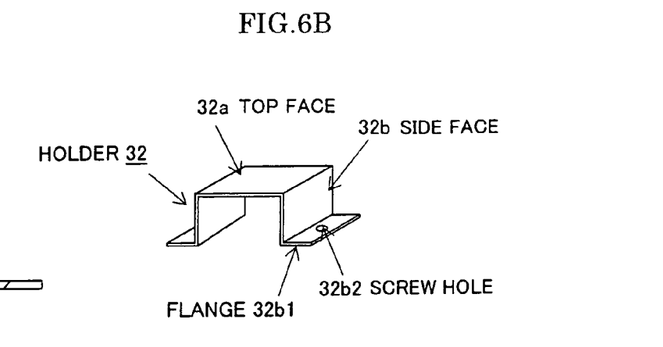

Namely, as shown in FIG. 6B, a holder 32 used in this embodiment [6] is provided with a top face 32a, a side face 32b holding the top face 32a, a flange 32b1 connected to the side face 32b and a screw hole 32b2 provided in the flange 32b1.

Figure 6C:
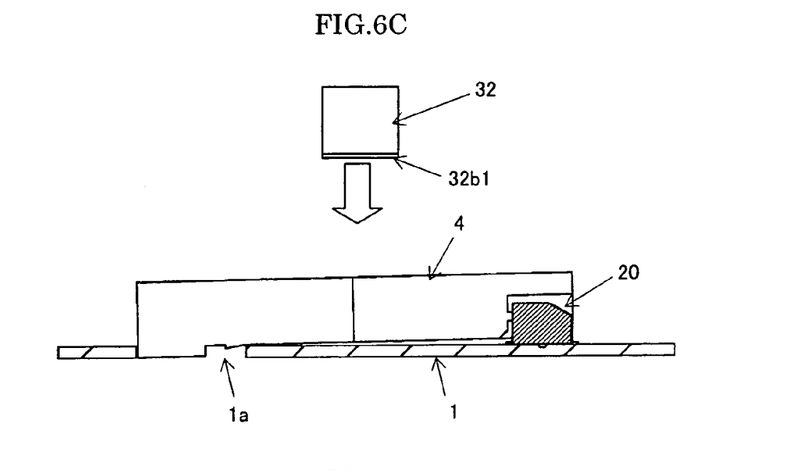
Figure 6D:
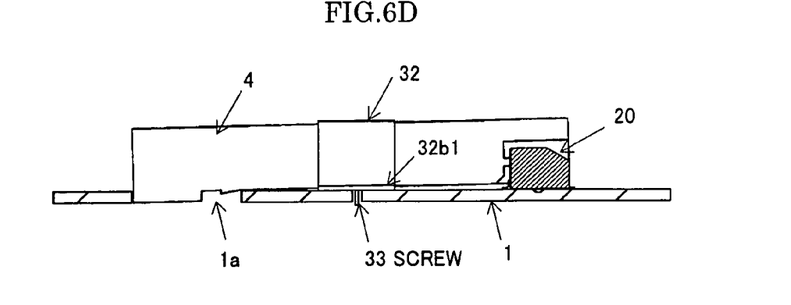

By using this holder 32, the SFP module 4 having moved pivotally down to a state parallel to the PT board as shown in FIG. 6C is covered with the holder 32 from the above to be held and secured by a screw through the screw hole 32b2 as shown in FIG. 6D.

Thus, the SFP module 4 can achieve a mounted state as shown in FIG. 6D withholding the returning elastic force by the electrode of the connector 20. However, also in this case, it is required that the machined hole 1a for preventing a disengagement of the SFP module 4 is provided in the PT board 1 as is the embodiment [4] of FIG. 4C.

It is to be noted that in the above-mentioned embodiments [3]–[6], as shown in FIGS. 3H and 3I, when the SFP module 4 is inserted into the connector 20, it is required that a corner portion 3f is cut and a corner portion 20d in the connector 20 is cut in order to avoid an interference with the PT board 1.

What is claimed is:

1. An SFP module mounting structure comprising:
   a printed board;
   a connector mounted on the printed board;
   an SFP module connected to the connector; and
   a holder holding the SFP module, the holder having both side faces which hold the SFP module on the both sides, a flap which is provided on an upper edge of the both side faces so as to make the SFP module insertable and extractable in an oblique upper direction as well as to prevent the SFP module from being disengaged upward and a bottom face which supports the both side faces on the printed board.

2. The SFP module mounting structure as claimed in claim 1, wherein the both side faces of the holder are provided with a plurality of connector pins with standoffs which have different lengths so that the both side faces are lowered from a head of the SFP module towards the connector.

3. The SFP module mounting structure as claimed in claim 1, wherein the flap has a curve which makes the SFP module easy to be inserted into the holder.

4. The SFP module mounting structure as claimed in claim 1, wherein the bottom face has a locking portion which prevents the SFP module from being disengaged.

5. The SFP module mounting structure as claimed in claim 1, wherein the connector is provided with an electrode which is connected to the SFP module when the SFP module is inserted into the holder from the oblique upper direction and which has a returning elastic force enabling the SFP module to move pivotally down to a state that is parallel to the printed board.

6. The SFP module mounting structure as claimed in claim 5, wherein the bottom face of the holder has a portion preventing the SFP module from being disengaged.

7. The SFP module mounting structure as claimed in claim 5, wherein the printed board has a machined hole which prevents the SFP module from being disengaged.

8. The SFP module mounting structure as claimed in claim 5, wherein the both side faces of the holder are provided with a plurality of connector pins with standoffs which have different lengths so that the both side faces are lowered from a head of the SFP module towards the connector.

9. An SFP module mounting structure comprising:
a printed board;
a connector mounted on the printed board;
an SFP module connected to the connector; and
a holder holding the SFP module, the connector being provided with an electrode which is connected to the SFP module when the SFP module is inserted into the holder from an oblique upper direction and which has a returning elastic force enabling the SFP module to move pivotally down to a state that is parallel to the printed board, and the holder having a top face which partially covers a top face of the SFP module and both side faces which secure the top face on the printed board on the both sides of the SFP module.

10. The SFP module mounting structure as claimed in claim 9, wherein the printed board has a machined hole which prevents the SFP module from being disengaged.

* * * * *